(12) United States Patent
Sarin et al.

(10) Patent No.: US 11,799,489 B2
(45) Date of Patent: Oct. 24, 2023

(54) TEMPERATURE COMPENSATED COMMON COUNTER ADC METHOD FOR NEURAL COMPUTE

(71) Applicants: Vishal Sarin, Saratog, CA (US); Vikram Kowshik, Cupertino, CA (US); Sankha Subhra Saha, Santa Clara, CA (US); Siraj Fulum, Milipitas, CA (US)

(72) Inventors: Vishal Sarin, Saratog, CA (US); Vikram Kowshik, Cupertino, CA (US); Sankha Subhra Saha, Santa Clara, CA (US); Siraj Fulum, Milipitas, CA (US)

( * ) Notice: Subject to any disclaimer, the term of this patent is extended or adjusted under 35 U.S.C. 154(b) by 283 days.

(21) Appl. No.: 17/084,610

(22) Filed: Oct. 29, 2020

(65) Prior Publication Data

US 2021/0143828 A1 May 13, 2021

Related U.S. Application Data

(60) Provisional application No. 62/927,133, filed on Oct. 29, 2019.

(51) Int. Cl.
| | |
|---|---|
| *H03M 1/06* | (2006.01) |
| *G11C 11/54* | (2006.01) |
| *G06N 3/063* | (2023.01) |
| *G11C 16/04* | (2006.01) |
| *G11C 11/56* | (2006.01) |
| *G06N 3/04* | (2023.01) |
| *G06N 3/08* | (2023.01) |

(52) U.S. Cl.
CPC .......... *H03M 1/0602* (2013.01); *G06N 3/063* (2013.01); *G11C 11/54* (2013.01); *G06N 3/04* (2013.01); *G06N 3/08* (2013.01); *G11C 11/56* (2013.01); *G11C 16/04* (2013.01)

(58) Field of Classification Search
CPC ....... H03M 1/0602; G06N 3/063; G06N 3/04; G06N 3/08; G11C 11/54; G11C 13/0069
See application file for complete search history.

(56) References Cited

U.S. PATENT DOCUMENTS 10,489,700 B1 * 11/2019 Asnaashari ............ G06N 3/049

* cited by examiner

*Primary Examiner* — Joseph J Lauture (57) ABSTRACT

The method provides for a low power and a temperature independent analog to digital convertor for systems which use non-volatile cells for forming neurons to be used for neural network applications. The method uses a common counter which can be an up-counter or a down-counter depending on implementation, but in which the source and sink currents to a comparator are changed with temperature by the same percentage as the average bit line current for specific weight distributions programmed in the non-volatile cells forming the neurons. The method uses charge accumulation for detecting the average neuron current.

16 Claims, 9 Drawing Sheets

TEMPERATURE COMPENSATED COMMON COUNTER ADC METHOD FOR NEURAL COMPUTE

CROSS-REFERENCE TO RELATED APPLICATIONS

This application claims priority to U.S. provisional patent application No. 62/927,133, titled METHODS AND SYSTEMS OF NEURAL-ARRAY BASED FLASH MEMORY and filed on 29 Oct. 2019. This application is hereby incorporated by reference in its entirety.

BACKGROUND

1. Field

This application relates generally to electronic circuits, and more particularly to a system, method, and article of manufacture of a common counter ADC method for neural compute.

2. Related Art

Neural networks are increasingly used for various use cases for artificial intelligence, such as, inter alia: vision analysis (e.g. object detection, tracking, etc.); natural language processing; anomaly detection on a range of devices; analysis on industrial and medical sensors; and many other such applications. A key element of neural network computing is to enable trillions of multiply-add operations which makes it very compute and power hungry. The implementation techniques for neural networks presented in the current invention enables such compute operations at very high-performance levels while consuming very low energy. This opens up the possible applications which can benefit from neural networks.

SUMMARY OF THE INVENTION

The method provides for a low power and a temperature independent analog to digital convertor for systems which use non-volatile cells for forming neurons to be used for neural network applications. The method uses a common counter which can be an up-counter or a down-counter depending on implementation, but in which the source and sink currents to a comparator are changed with temperature by the same percentage as the average bit line current for specific weight distributions programmed in the non-volatile cells forming the neurons. The method uses charge accumulation for detecting the average neuron current.

BRIEF DESCRIPTION OF THE DRAWINGS

FIGS. 4 A-D illustrate an example system(s) for temperature compensation on dual slope ADC, according to some embodiments.

The Figures described above are a representative set and are not exhaustive with respect to embodying the invention.

DESCRIPTION

Disclosed are a system method, and article of manufacture of implementing a common counter ADC method for neural compute. The following description is presented to enable a person of ordinary skill in the art to make and use the various embodiments. Descriptions of specific devices, techniques, and applications are provided only as examples. Various modifications to the examples described herein can be readily apparent to those of ordinary skill in the art, and the general principles defined herein may be applied to other examples and applications without departing from the spirit and scope of the various embodiments.

Reference throughout this specification to 'one embodiment,' 'an embodiment,' 'one example,' or similar language means that a particular feature, structure, or characteristic described in connection with the embodiment is included in at least one embodiment of the present invention. Thus, appearances of the phrases 'in one embodiment,' 'in an embodiment,' and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art can recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, and they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Definitions

Example definitions for some embodiments are now provided.

Analog-to-digital converter (ADC) is a system that converts an analog signal into digital bits.

Comparator is a device that compares two voltages or currents and outputs a digital signal indicating which is larger.

Neuron, or neural cell, can be a system of non-volatile memory cells. In some examples, the equation for a neuron can be:

$Eq^{neuron} = \Sigma(X_i * Y_i) + b$. Here, $X_i$ is the set of input vectors, $Y_i$ is the parameter which can be related to the amplification of the output relative to the input of individual non-volatile memory cells, and b is a bias variable.

Neural array can be a plurality of coupled neural cells.

Pulse-width modulation (PWM) is a method of delivering an electrical signal, based on the input vector value. The average value of current fed to the load (bit line) is controlled by turning the switch (flash cells) on for a specific time determined by the input vector. The higher the input vector the longer is the time the switch (flash cell) is turned on, leading to higher charge delivered to the load (bit line).

Example Computer Architecture and Systems

Figure 1A:
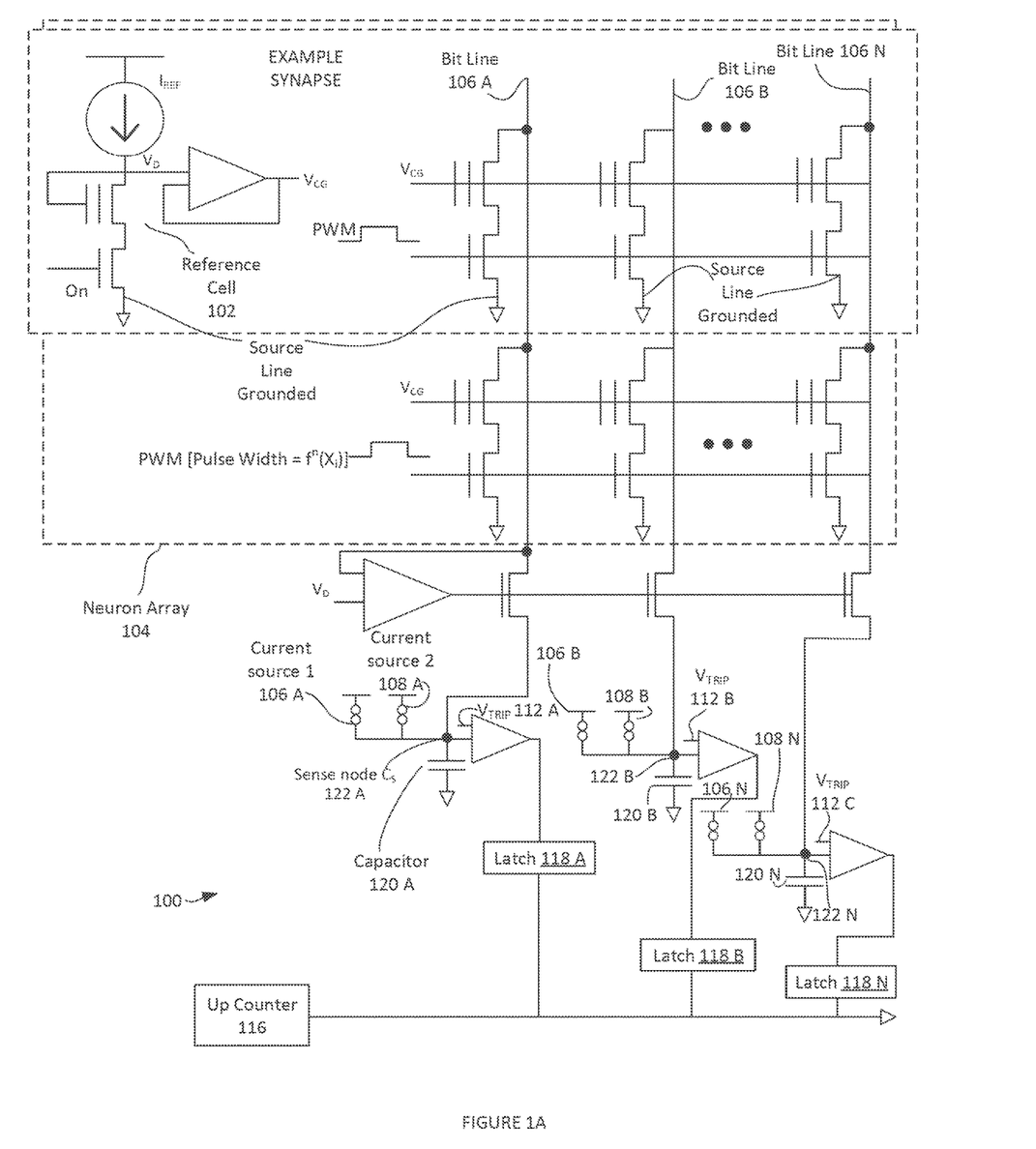
FIGS. 1A-B illustrates example systems for implementing common counter ADC methods for neural compute, according to some embodiments.
Figure 1B:
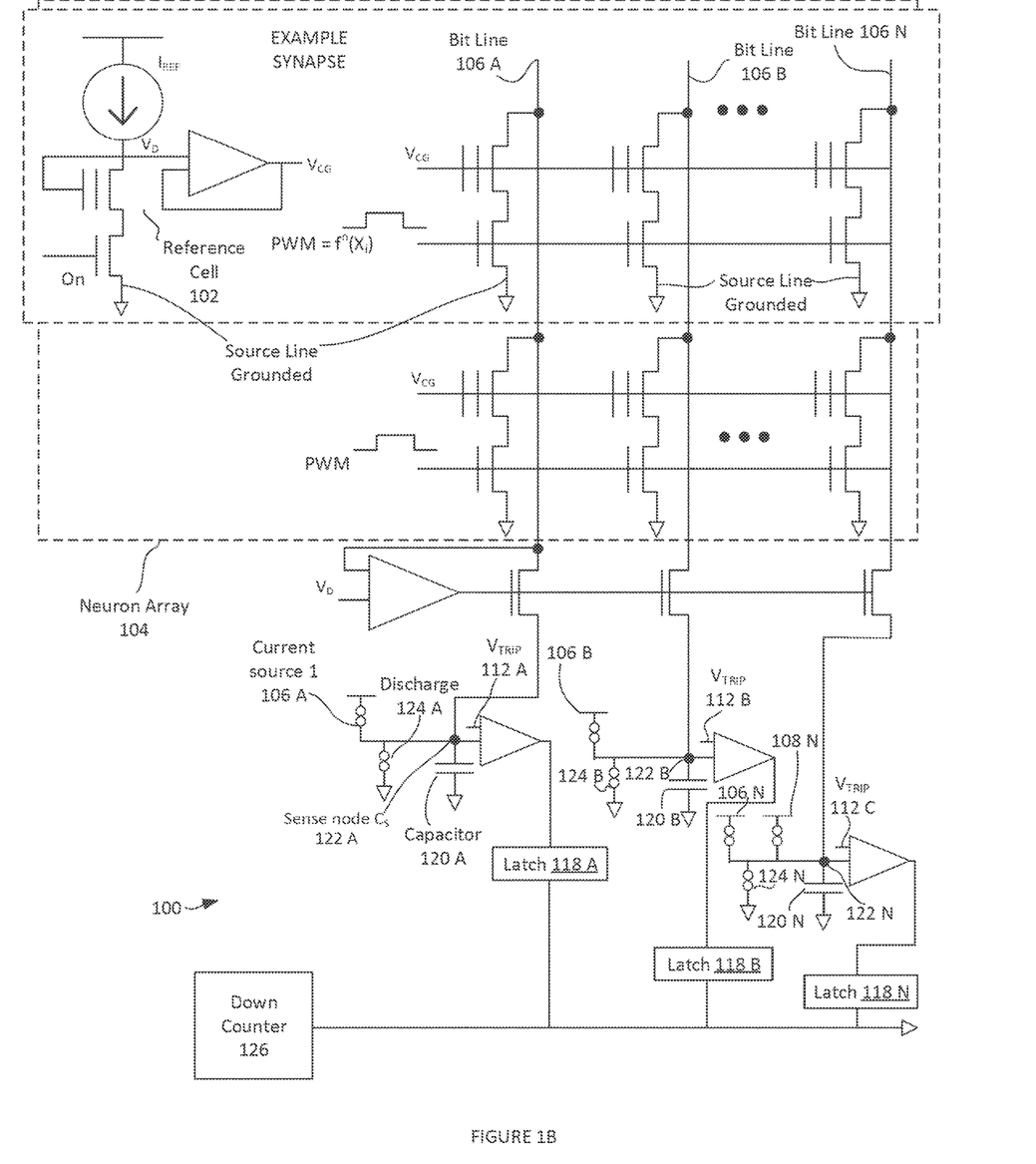

FIGS. 1A-B illustrates example systems 100 for implementing common counter ADC methods for neural compute, according to some embodiments.

In some embodiments, each cell in system 100 can include Neuron Array 104.

Neuron Array 104 can include a plurality of neural cells. Each neural cell can provide multiple levels of information per cell, i.e. MLC memory. In some embodiments, the underlying cell technology may be flash memory. The neural cells of Neuron Array 104 can be used to generate one or more neurons. The neuron equation is provided as follows:

$$Eq^{neuron} = \Sigma(X_i * Y_i) + b$$

$X_i$ is the set of input vectors. Each $X_i$-input vector is translated into an equivalent pulse width. For example, in FIGS. 1A-B, the flash cells of reference cell(s) 102 receive an equivalent $I_{Ref}$ current as shown. Reference cell(s) 102 then provides a control gate voltage $V_{CG}$ to Neuron Array 104.

$Y_i$ is the set of parameters of weight vectors (e.g. as provided by the respective flash cells, etc.) and each $Y_i$ is a parameter of a non-volatile memory cell. In one embodiment, this can be a function of one or more threshold voltages of individual flash memory cells. Each $X_i \cdot Y_i$ combination forms a synapse. The synapses are coupled with a bit line (e.g. bit lines 106 A-N). Bit lines 106 A-N receive a specified output from the neural cell as provided by the neuron equation. b is the bias variable of the equation. In one embodiment, b can be set as a fixed bias current per bit line. The flash cells can be NMOS or PMOS flash cells.

Figure 2A:
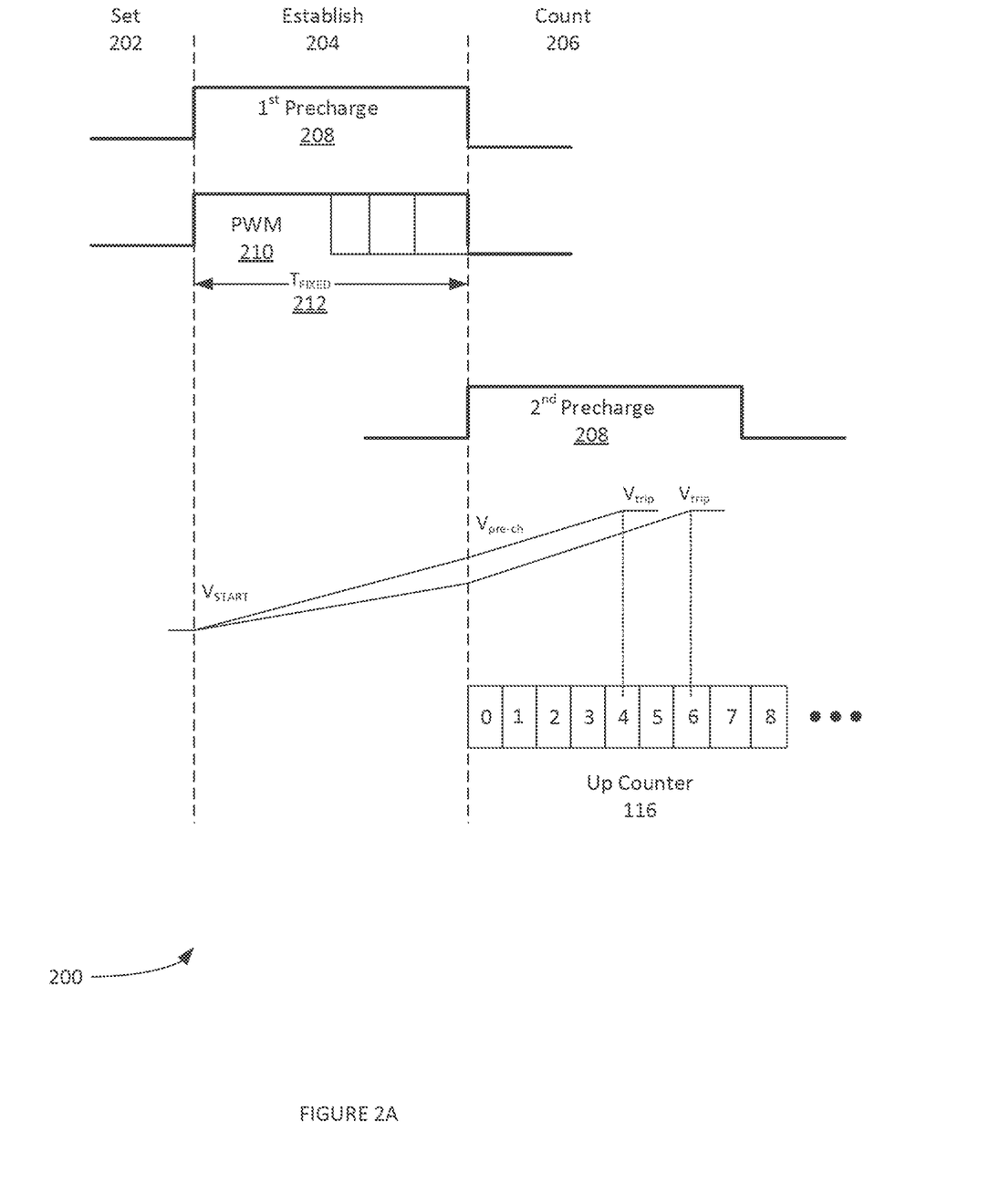
FIG. 2A illustrates an example first option for implementing a common counter ADC method for neural compute, according to some embodiments.

FIGS. 1A and 2A illustrate an example first option 200 for implementing a common counter ADC method for neural compute, according to some embodiments. As shown, there are three phases to ADC: setting phase 202, establish phase 204, and counting phase 206. In a first count, a sense node is established first taken to a start voltage, $V_{START}$. After this, the sense node charges. During establish phase 204, the sense node (e.g. sense nodes 122 A-N) is charging the capacitor (e.g. capacitors 120 A-N) with 1st Precharge 208 as a constant current (e.g. using current source 1 106 A-N). This is represented by the increasing sense node voltage in establish phase 204 of FIG. 2A.

While the current is charging the capacitor (e.g. capacitors 120 A-N), it is strongest along the flash cells along the bit lines are sinking current for different periods of time depending on how long a respective flash cell is kept on. For example, a first flash cell is on for 10 nanoseconds so it is sinking current for 10 nanoseconds; a second flash is on for 20 nanoseconds and so is sinking current for 20 nanoseconds; and so on. All along the way, while the current source(s) is charging up the capacitor(s), the flash cells are discharging the capacitor(s) for varying periods depending on input vectors $X_i$. Accordingly, there is a simultaneous charge up and a discharge of the capacitor(s). The ramp up rate of FIG. 2A depends on the difference between the constant charge up current and the varying amounts of bit line discharge currents. PWM 210 shows the pulses of the various flash cells which are on for different periods of time within a fixed time period $T_{fixed}$ 212. The charge that is accumulating on the capacitor is the difference between the $I_{source}$ and the amount of current that is being sunk by the flash cells on the bit line (e.g. $I_{BL}$). The ramp up continues until the last input pulse is complete. Depending on the constant charge up and the charge down, a certain amount of charge is accumulated on the capacitor. The amount of accumulated charge provides a pre-charge voltage $V_{pre-ch}$ on the sense node. In this way, once the capacitor is charged, the amount of charge provides information about how much current was added to the capacitor and how much was subtracted by the flash cells.

After the $V_{pre-ch}$ value is reached, the turn on the up counter 116. Up counter 212 can count from 0 upwards in count phase 206. In count phase 206, 1st Precharge (e.g. of Current source 106 A) is turned off. 2nd Precharge (e.g. using current source 2 108 A-N) is turned on. 2nd Precharge charges the capacitor until it hits a trip point set by $V_{trip}$. As soon as the trip point attained, whatever was the value of the counter is provided as the count to a respective latch (e.g. of latches 118 A-N). The latch saves the count. Each latch may save a different count depending on when the comparator trips. Because the source current was constant during establish phase 204 and the bit line sink current was varied if the average bit line sink current is high then the total charge that has been accumulated would be less than if the average bit line sink current was lower. Accordingly, the respective $V_{pre-charge}$ would be lower and it takes longer to reach the comparator trip point. FIG. 2A illustrates a schematic example of this by comparing two instances of two different up counts. As shown, the lower the initial $V_{pre-charge}$ the longer it takes 2nd Precharge 210 to reach the trip point and thus the higher the ADC count at the trip point. As shown, the high count is proportional to high sink current. As the bit line current of system 100 functions as the sink current, in this way, the average bit line(s) current value(s) can control the count obtained. The higher the average bit line(s) current value(s) lead to a higher count. The lower the average bit line(s) current value(s) lead to a lower count; and the count effectively is the measure of the average bit line current.

Figure 2B:
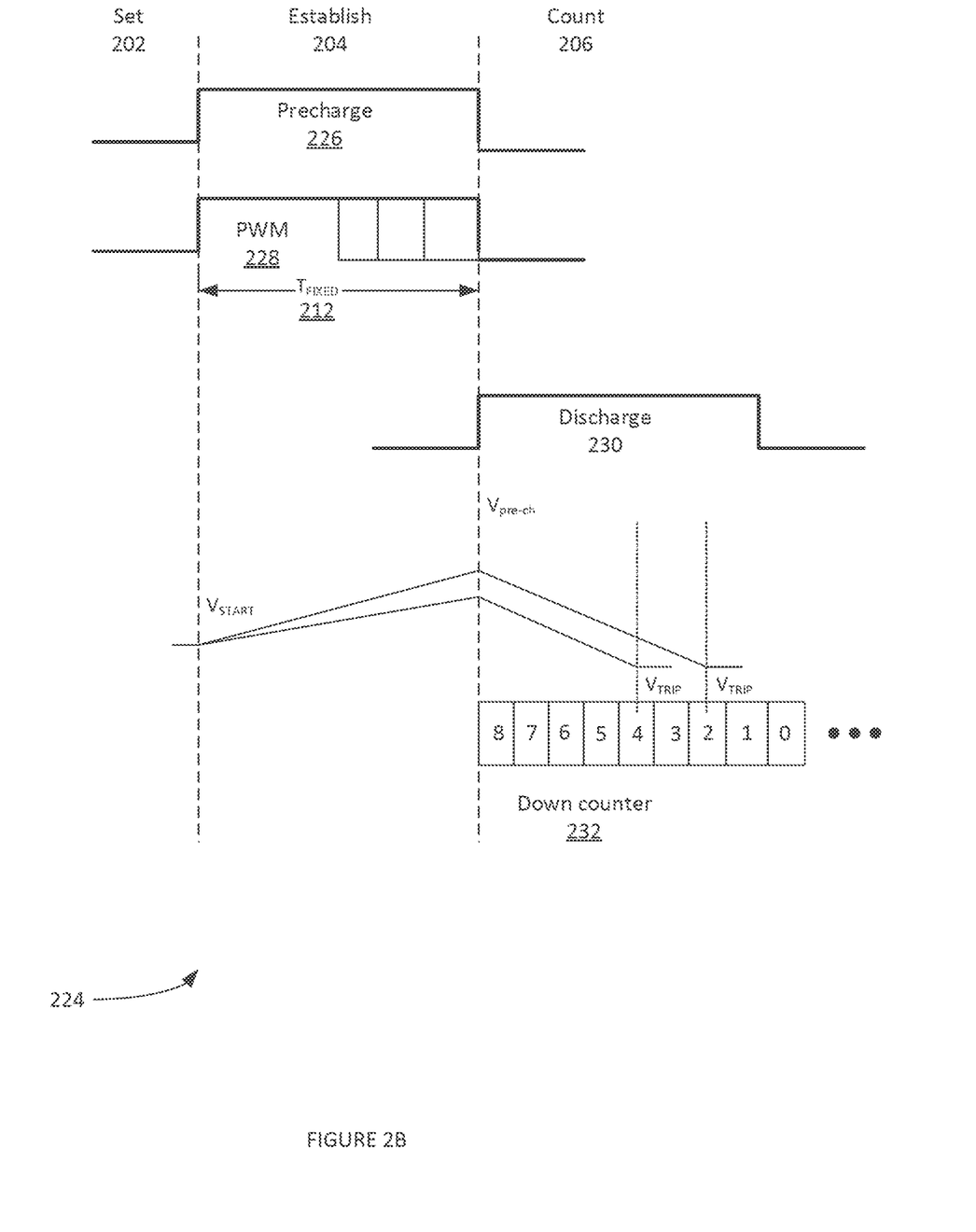
FIG. 2B illustrates an example second option for implementing a common counter ADC method for neural compute, according to some embodiments.

FIGS. 1B and 2B illustrate an example second option 224 for implementing a common counter ADC method for neural compute, according to some embodiments. It is noted that FIG. 1B shows another version of system 100 with only current source 1 106 A-N. Current source 1 108 A-N is removed and replaced with discharge 124 A-N. The respective sense nodes and bit lines of system 100 are brought to pre-determined voltage(s) in set phase 202. For example, sense nodes 122 A-N are brought to $V_{START}$ as shown by precharge 226 from current source 1 108 A-N. During the establishment phase 204, sense nodes 122 A-N are recharged with precharge 226. While pre-charging the sensing capacitance of capacitors 120 A-N of sense nodes 122 A-N, system 100 is also discharging by the bit line current. Accordingly, the amount of charge in capacitors 120 A-N is equal to the current source 1 108 A-N minus the bit line current. The higher the bit line current(s) average (e.g. as provided by PWM 228) is the lower the pre-charge (e.g. as in option 1 discussed supra). Establish phase 204 is for a specified fixed period of time (e.g. $T_{fixed}$ 228).

The count phase 206 for option 2 is different than that of option 1. In option 2, the i-sink current of discharge 124 A-N in turned on when $V_{pre-ch}$ is reached and count phase 206 is initiated. The bit line current is turned off at this point as well such that only the constant i-sink current is present during count phase 206.

The counter is now down counter 126. Down counter 126 can begin at a specified count and then down count. For example, down counter 126 can begin at 255 and count down to 0. As soon as the trip point is reached and detected by the comparator, whatever was the value of the counter is provided as the count to latch on the respective latches as the ADC output (e.g. of latches 118 A-N).

As shown in FIG. 2B, down counter 126 down counts when a trip point (e.g. $V_{TRIP}$) is reached in sense nodes 122 A-N by the i-sink current (e.g. discharge 230). Accordingly, if the average bit line current was higher, the $V_{pre-ch}$ is lower. The lower the $V_{pre-ch}$ means it can take less time for discharge 230 to achieve $V_{TRIP}$, and the higher the down count value may be. The higher the $V_{pre-ch}$, the more time it can take discharge 230 to achieve $V_{TRIP}$, and the lower the down count value may be. The faster $V_{TRIP}$ is achieved the higher the count of the down counter 126. In this manner the latched count is representative of the average bit line current.

Figure 3:
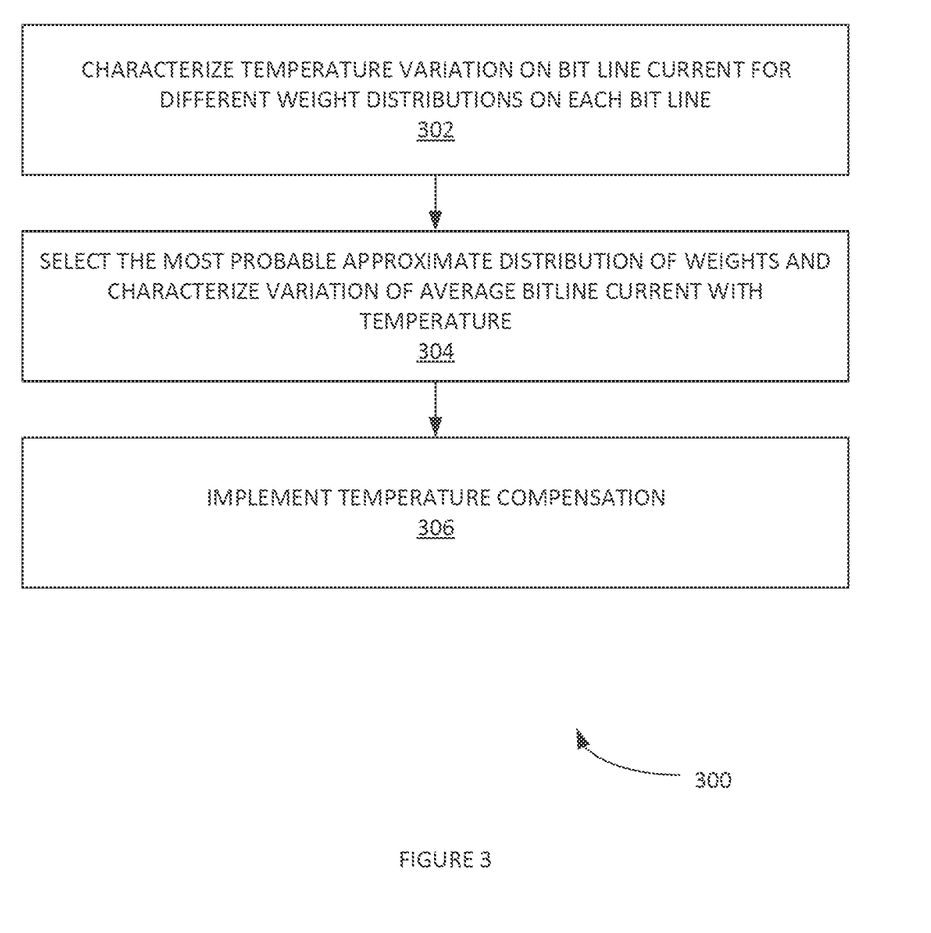
FIG. 3 illustrates an example system for temperature compensation on dual slope ADC, according to some embodiments.

FIG. 3 illustrates an example process 300 for temperature compensation on dual slope ADC, according to some embodiments. In step 302, process 300 can characterize temperature variation on bit line current for different weight distributions on each bit line. In step 304, process 300 can select the most probable approximate distribution of weights and characterize variation of average bit line current with temperature. In step 306, process 300 can measure temperature from temperature sensor.

In step 308, process 300 can implement temperature compensation. Process 300 can select one of two options. In a first option, depending on a measured temperature, process 300 changes the reference currents. The source and the sink reference currents must change by the same percentage as the change in the average bit line current as characterized by process 300. For example, process 300 can use a lookup table with a trim control to select a reference current(s) based on the measured temperature. Reference source currents and the reference sink currents on the sense node of the ADC can be used to effectively cancel the temperature increase or decrease of the bit line current with temperature. In this way, the ADC readout can be independent of temperature.

In a second option, depending on a measured temperature change, a trip point of the ADC comparator can be changed. Process 300 can utilize a lookup table with a trim control to choose the trip point. In this way, process 300 can effectively cancel the effect of an increase or decrease of the bit line current with temperature on the ADC readout. This can make the ADC readout effectively independent of temperature.

FIGS. 4 A-D illustrate example processes and systems for temperature compensation on dual slope ADC, according to some embodiments. More specifically FIG. 4A shows a first system for temperature compensation on dual slope ADC, according to some embodiments. A temperature sensor 402 can be used to obtain and provide a measured temperature readout 404. This can be provided to trim lookup table 406. Trim lookup table 406 can provide current or voltage trims 408. Current or voltage trims 408 can be used to set the values of controlled current/voltage sources 410. Controlled current/voltage sources 410 can manage/provide a temperature adjusted source and/or sink currents or $V_{TRIP}$ voltage 412. Different threshold voltages on flash cells attached to a bit line forming a neuron have slightly different variation in terms of % current variation with temperature. The method provides for characterizing average bit line current for different threshold voltage distributions and using the most relevant lookup table based on the most probable threshold voltage distribution.

Figure 4A:
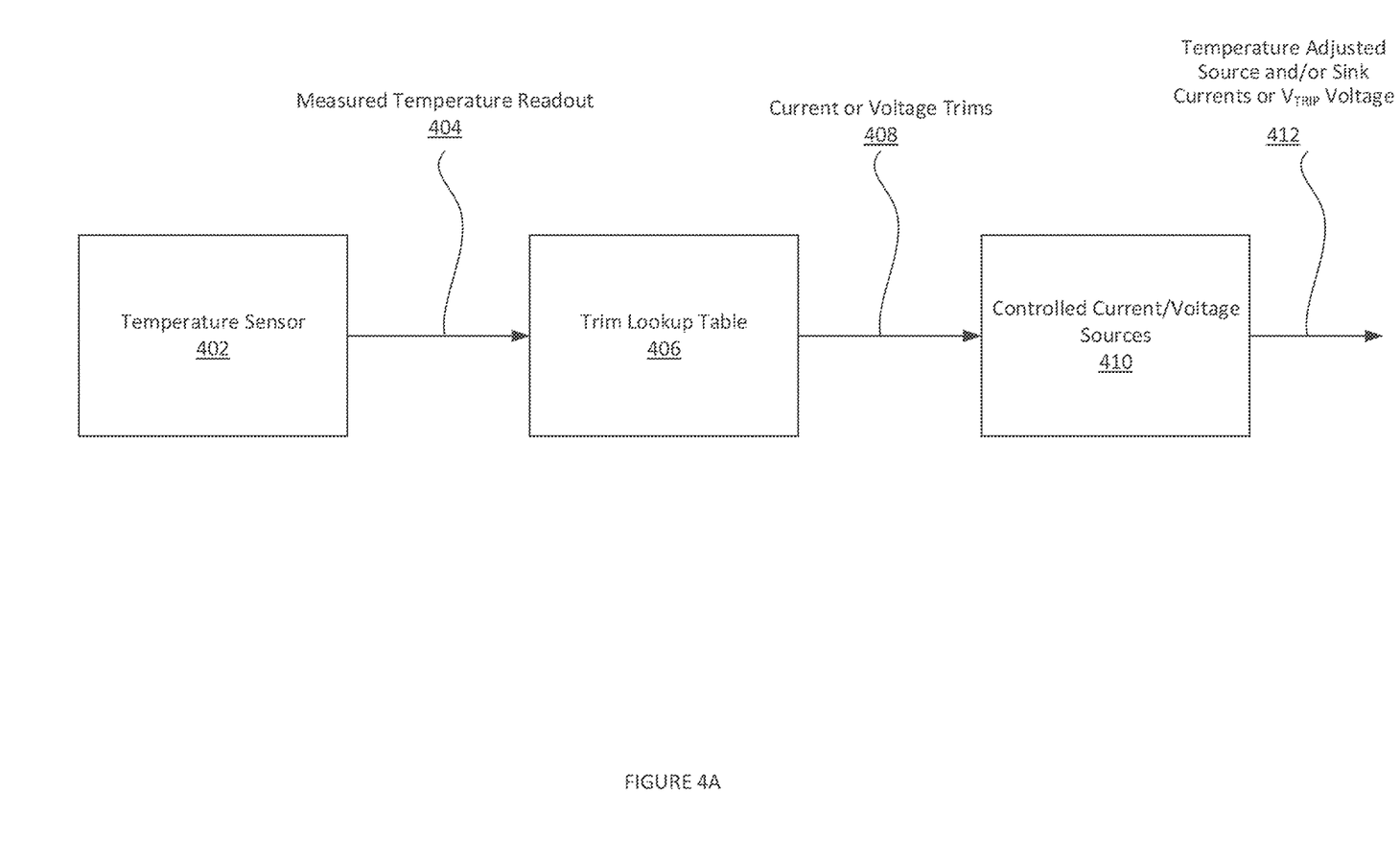
Figure 4B:
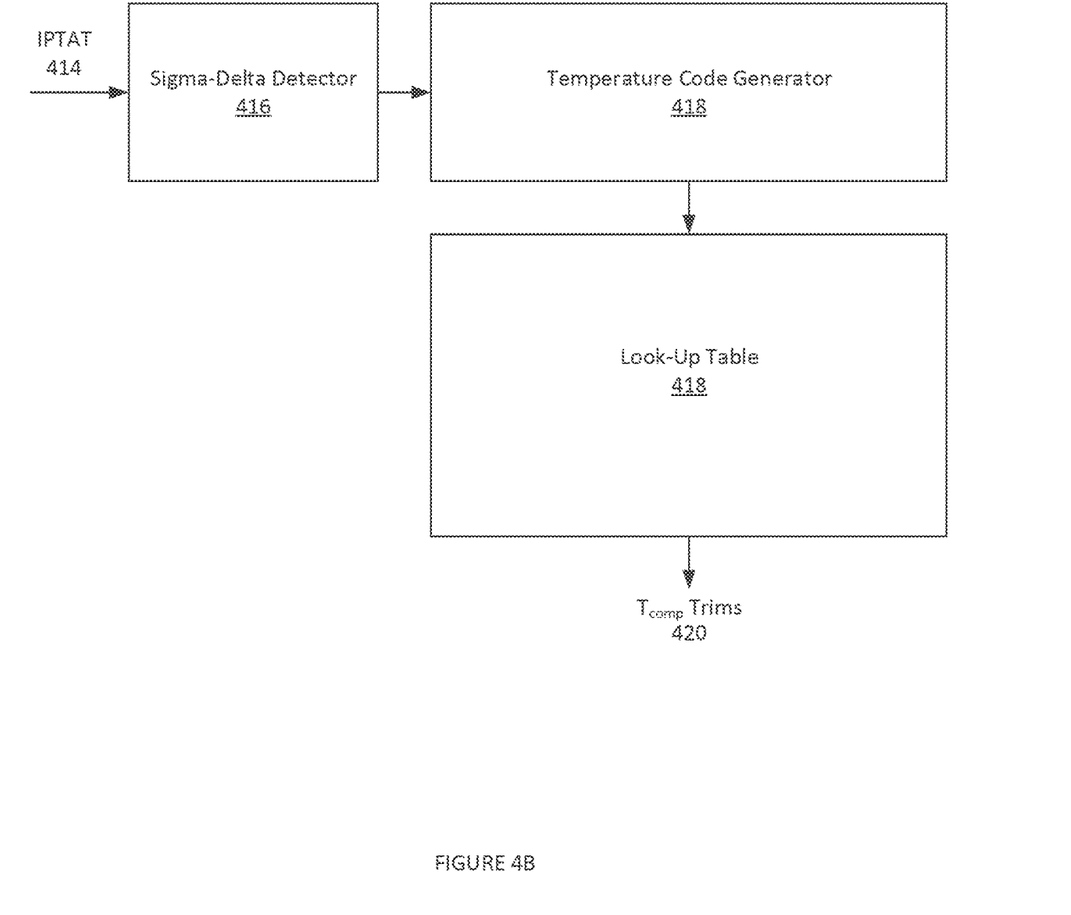

FIG. 4B shows a second system where IPTAT 414 (IPTAT is a current source which increases with increasing temperature) of a bandgap reference circuit is input into Sigma-Delta Detector 416 (A sigma-delta detector is a standard circuit for measuring a current by measuring the charge accumulated on a capacitor over a fixed time). The IPTAT current is temperature dependent and the sigma-delta detector measures the current and consequently gives an output which is temperature dependent. The output of Sigma-Delta Detector 416 is provided to look-up table 418. In one option of the second system, temperature compensation can be implemented using a sensed temperature in conjunctions with a look-up table 418 to generate different $T_{comp}$ adjustments 420. look-up table 418 can also receive. The $T_{comp}$ adjustments 420 for precharge and discharge (or trip voltages) as relevant to the implementation. The look-up table 418 can make adjustments for current and/or trip voltage. The look-up table 418 can depend on the neural weight distribution type. In this regard there can be different lookup tables, one for each distribution type. The most relevant lookup table (based on distribution type) can be used for accurate temperature compensation of the bit line current to get temperature independent ADC readout.

In a second option of the second system, the ADC count can be added to or subtracted from based on a sensed temperature value to obtain a correct ADC count. The look-up table 418 can be used to make adjustments to ADC count. This can depend on both the neural weight distribution type as well as the measured ADC count.

Figure 4C:
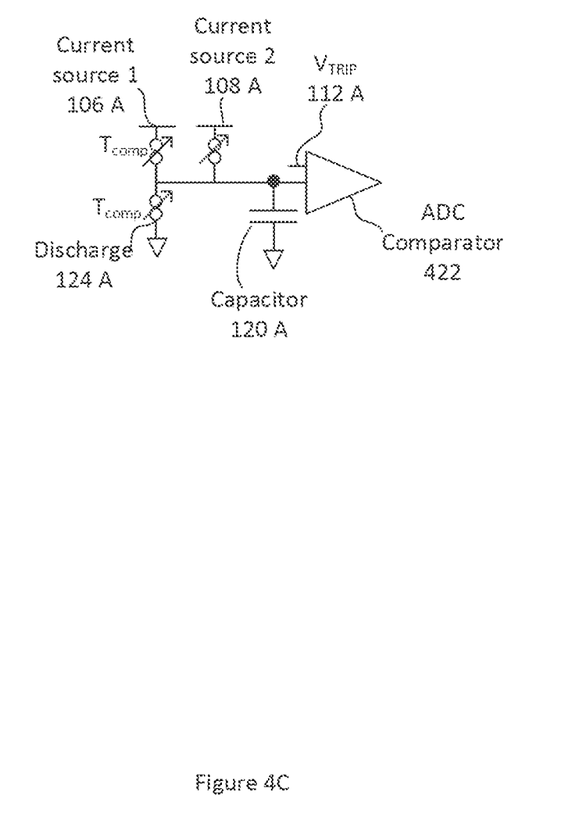

FIG. 4C illustrates an example modification to the systems for implementing common counter ADC methods for neural compute for temperature compensation, according to some embodiments. As shown, $T_{comp}$ can be applied to, inter alia: Current source 1 106A, Current source 2 108A, Discharge 124 A, etc. ADC Comparator 422 can convert the input to an output for a corresponding latch to save the count.

Figure 4D:
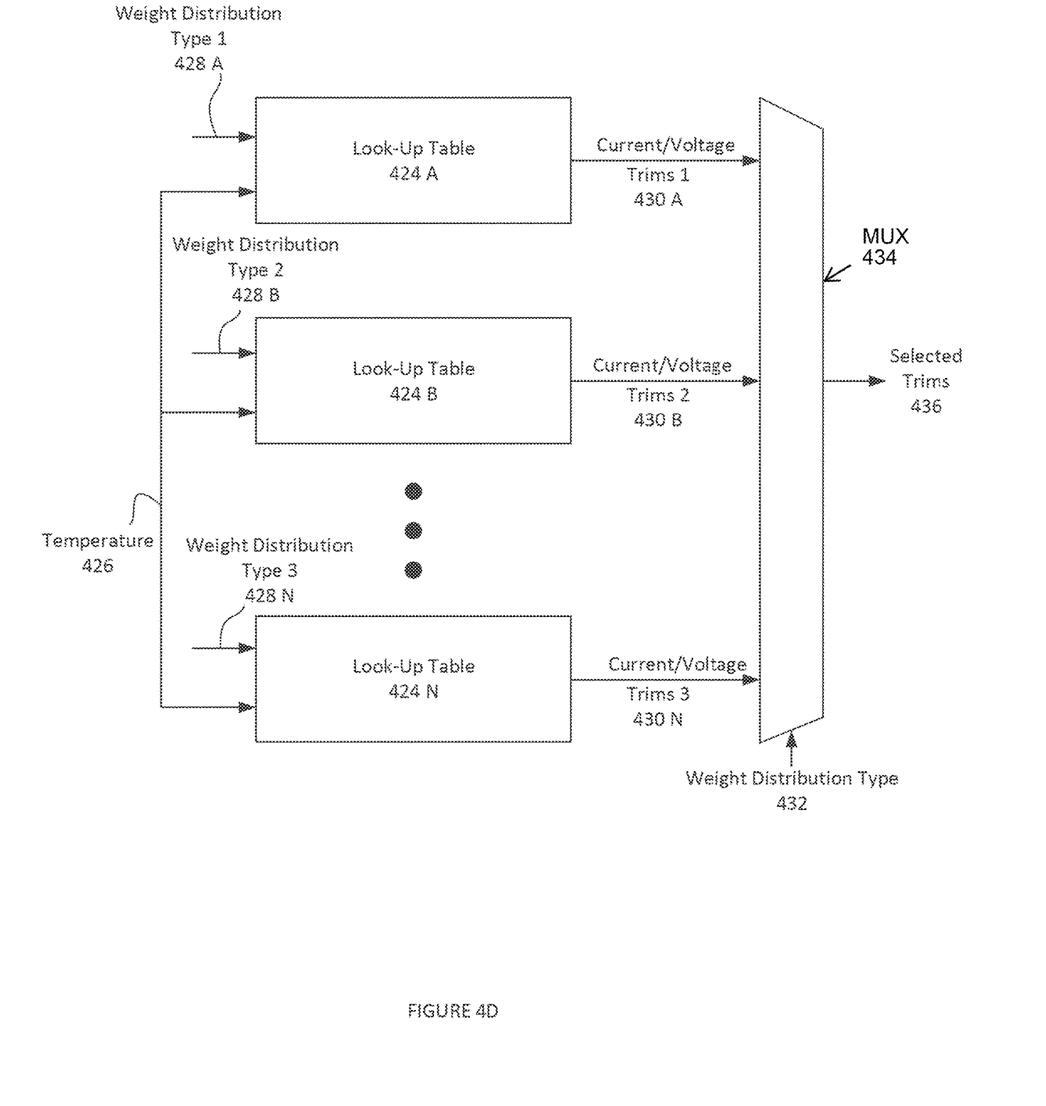

FIG. 4D illustrates an example of how different lookup tables can be used for trim control to compensate for temperature depending on the most relevant weight distribution for the neuron, according to some embodiments. This provides for a more accurate compensation to keep the ADC output independent of the temperature.

More specifically, FIG. 4D includes look-up tables 424 A-N. Look-up tables 424 A-N can receive temperature 426 and weight distribution types 1-3 428 A-N as inputs. Look-up tables 424 A-N can provide as outputs trims 1-3 430 A-N. Trims 1-3 430 A-N and weight distribution type 432 are provided to MUX 434. MUX 434 outputs selected trims 436.

CONCLUSION

A method of converting the average bit line current which is effectively independent of temperature is disclosed which can be used for neural network computation operation. The method provides for an analog to digital convertor which measures the average current of the bit line by way of charge accumulation. The method uses a common counter and multiple comparators (one for each bit line), with temperature compensated source and sink currents based on neural array temperature characterization.

Although the present embodiments have been described with reference to specific example embodiments, various modifications and changes can be made to these embodiments without departing from the broader spirit and scope of the various embodiments. Accordingly, the specification and drawings are to be regarded in an illustrative rather than a restrictive sense.

What is claimed as new and desired to be protected by Letters Patent of the United States is:

1. A common counter analog-to-digital converter (ADC) method for neural compute comprising:
   providing an array of non-volatile memory cells forming a number of neurons, wherein each word line of the array of cells gets a pulse of duration t, which is a function of an input vector xi, and wherein a current of the cell is a function of a weight parameter yi, such that the product xi*yi provides a charge to the bit line forming the neuron proportional to the input vector and the weight parameter;
   with a common counter, which counts up and wherein the common counter output is provided as an input to at least one analog to digital convertor (ADC); and
   with at least one ADC, measuring an average current value of bit line forming a neuron by way of charge accumulation.

2. The common counter ADC method of claim 1, wherein the ADC output is effectively independent of temperature.

3. The common counter ADC method of claim 2, wherein the average bit line current is used for a neural network computation operation.

4. The common counter ADC method of claim 3 further comprising:
   providing a plurality of comparators with two temperature compensated source currents; and wherein a first source is used to charge a sense node for a fixed time when the bit line current is on, and a second current source is used to subsequently charge the sense node when the bit line current is off and till a specific trip point is reached, and wherein a count from the common counter which counts up, is latched as the ADC output when the trip point is reached.

5. The common counter ADC method of claim 4, wherein a temperature compensation is based on a neural array bit line current temperature characterization, by measuring the percentage change in the bit line current at different temperatures.

6. The common counter ADC method of claim 5 further comprising:
   implementing the temperature characterization of the bit line current for different types of probable weight (yi) distributions; and
   using a most probable weight distribution data for temperature compensation of the bit line forming the neuron.

7. The common counter ADC method of claim 6, wherein the two source currents are changed with temperature by the same percentage as the average bit line current forming the neuron, as determined by the bit line current temperature characterization.

8. The common counter ADC method of claim 4, wherein the sense node trip point is changed with temperature, so that the ADC output is effectively independent of temperature.

9. A common counter analog-to-digital converter (ADC) system for neural compute comprising:
   an array of non-volatile memory cells forming a number of neurons, wherein each word line of the array of cells gets a pulse of duration t, which is a function of an input vector xi, and wherein a current of the cell is a function of a weight parameter yi, such that the product xi*yi provides a charge to the bit line forming the neuron proportional to an input vector and the weight parameter;
   with a common counter which counts down and wherein the common counter output is provided as an input to at least one analog to digital convertor (ADC); and
   with at least one ADC, measuring an average current value of bit line forming a neuron by way of charge accumulation.

10. The common counter ADC method of claim 9, wherein the ADC output is effectively independent of temperature.

11. The common counter ADC method of claim 10, wherein the average bit line current is used for a neural network computation operation.

12. The common counter ADC method of claim 11 further comprising:
   providing a plurality of comparators with one temperature compensated source current and one temperature compensated sink current, and wherein the source is used to charge a sense node for a fixed time when the bit line current is on, and wherein the current sink is used to subsequently discharge the sense node when the bit line current is off and till a specific trip point is reached, and wherein a count from the common counter which counts down, is latched as the ADC output when the trip point is reached.

13. The common counter ADC method of claim 12, wherein a temperature compensation is based on a neural array bit line current temperature characterization, by measuring the percentage change in the bit line current at different temperatures.

14. The common counter ADC method of claim 13 further comprising:
   doing the temperature characterization of the bit line current for different types of probable weight (yi) distributions, and using a most probable weight distribution data for temperature compensation of the bit line forming the neuron.

15. The common counter ADC method of claim 14, wherein the current source and the current sink to the sense node are changed with temperature by the same percentage as the average bit line current forming the neuron, as determined by the bit line current temperature characterization.

16. The common counter ADC method of claim 9, wherein the sense node trip point is changed with temperature, so that the ADC output is effectively independent of temperature.

* * * * *